United States Patent [19]
Check et al.

[11] 3,931,531
[45] Jan. 6, 1976

[54] OVERLAPPED SIGNAL TRANSITION COUNTER

[75] Inventors: Glenn P. Check; Roger F. Dimmick, both of Rochester, Minn.

[73] Assignee: International Business Machines Corporation, Armonk, N.Y.

[22] Filed: Dec. 17, 1974

[21] Appl. No.: 533,736

[52] U.S. Cl............... 307/220 R; 307/261; 328/41; 328/157; 318/603
[51] Int. Cl.² ...................................... H03K 21/06
[58] Field of Search........ 307/220 R, 216, 231, 260, 307/261, 269; 328/39, 41, 42, 110, 156–157

[56] References Cited
UNITED STATES PATENTS

| | | | |
|---|---|---|---|
| 3,466,517 | 9/1969 | Leenhouts | 318/603 |
| 3,671,876 | 6/1972 | Oshiro | 307/216 X |
| 3,697,779 | 10/1972 | Gee | 307/216 X |

*Primary Examiner*—John Zazworsky
*Attorney, Agent, or Firm*—Donald F. Voss

[57] ABSTRACT

A counter circuit counts all transitions of two or more overlapped out of phase bi-level signals under control of a start signal by combining the input signals via an exclusive OR circuit into a single signal having the transitions of all input signals. The levels of this single signal are applied to a polarity hold circuit and the level present upon the occurrence of an asynchronously occurring start signal is stored therein. The polarity hold circuit provides a pair of gating signals to a logical AND/OR network having an output containing both the positive and negative transitions of the single signal. The detected transitions are fed into a binary counter whose first stage consists of the AND/OR network.

7 Claims, 5 Drawing Figures

OVERLAPPED SIGNAL TRANSITION COUNTER

BACKGROUND OF THE INVENTION

1. Field of the Invention

This invention relates to counter circuitry and more particularly to counter circuitry for counting all transitions of two or more overlapped out of phase bi-level signals.

The invention finds particular utility in position control systems. For example, it can be used to control the operation of a stepping motor. It is not uncommon for stepping motors to operate in a fashion where out of phase emitter pulses taken from an emitter driven by the stepping motor are fed back to further drive the stepping motor. The stepping motor continues to operate until it has taken a predetermined number of steps. The counter of this invention can be used to keep track of the number of steps taken by the stepping motor. The stepping motor can be connected to position any element and, for example, could be used to operate a paper carriage for advancing continuous forms in a printer. Assume that it takes 16 steps to advance the continuous forms one line space. Then, after the printer completes a line of printing, a control unit would issue a start signal to the stepper motor. The stepper motor would step continuously until the start signal is dropped. The start signal would drop after the counter counts 16 overlapped transitions from the emitter driven by the stepper motor.

2. Description of the Prior Art

Heretofore, signal transitions of two or more overlapped out of phase bi-level signals were counted by applying the separate signals to separate counters and then the outputs of the separate counters were logically combined to provide an overall count of the transitions. In other instances a sequence detector and reversible counter are used in combination. The sequence detector logically combines the incoming signals into phase pairs and examines the sequence thereof to determine the direction for advancing the counter. Such an arrangement is represented by U.S. Pat. No. 3,165,680 dated Jan. 12, 1965, for "Digital Position Control Servosystem". Other prior art approaches utilize analog circuitry such as differential networks and clipping circuitry to develop the counter advance pulses. All of the aforementioned approaches are more complex and thus involve either more circuitry in the case of the prior art digital approaches or in the case of analog approaches require more expensive circuitry. In any event the prior art approaches are more costly than the present invention.

SUMMARY OF THE INVENTION

The principal objects of the invention are to provide improved counter circuitry for counting transitions of two or more overlapped out of phase bi-level signals which:
 a. has a minimal number of logic elements,
 b. uses standard digital logic elements, and
 c. is relatively inexpensive.

The foregoing objects are achieved by logically combining the separate overlapped signals into a single signal having all of the transitions of the separate signals. The level of the single signal at the occurrence of an asynchronous start signal is stored and used to gate the subsequent changes in level of the single signal into a counter for counting the transition occurring in the separate signals.

DESCRIPTION

Figure 1:
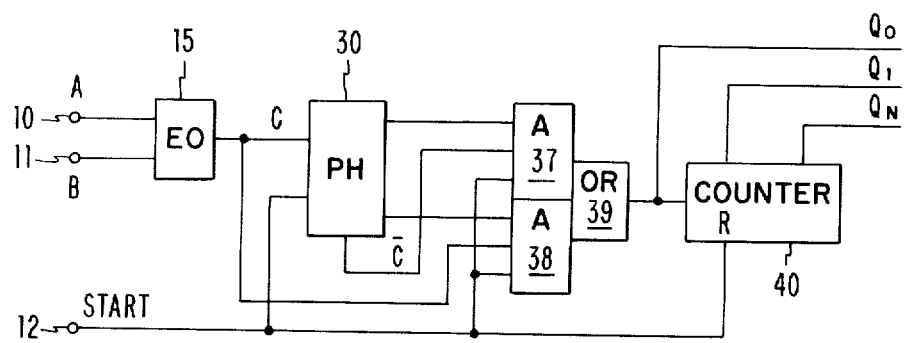
FIG. 1 is a block diagram illustrating the invention embodied to count transitions occurring in two out of phase overlapped input signals.
Figure 3:
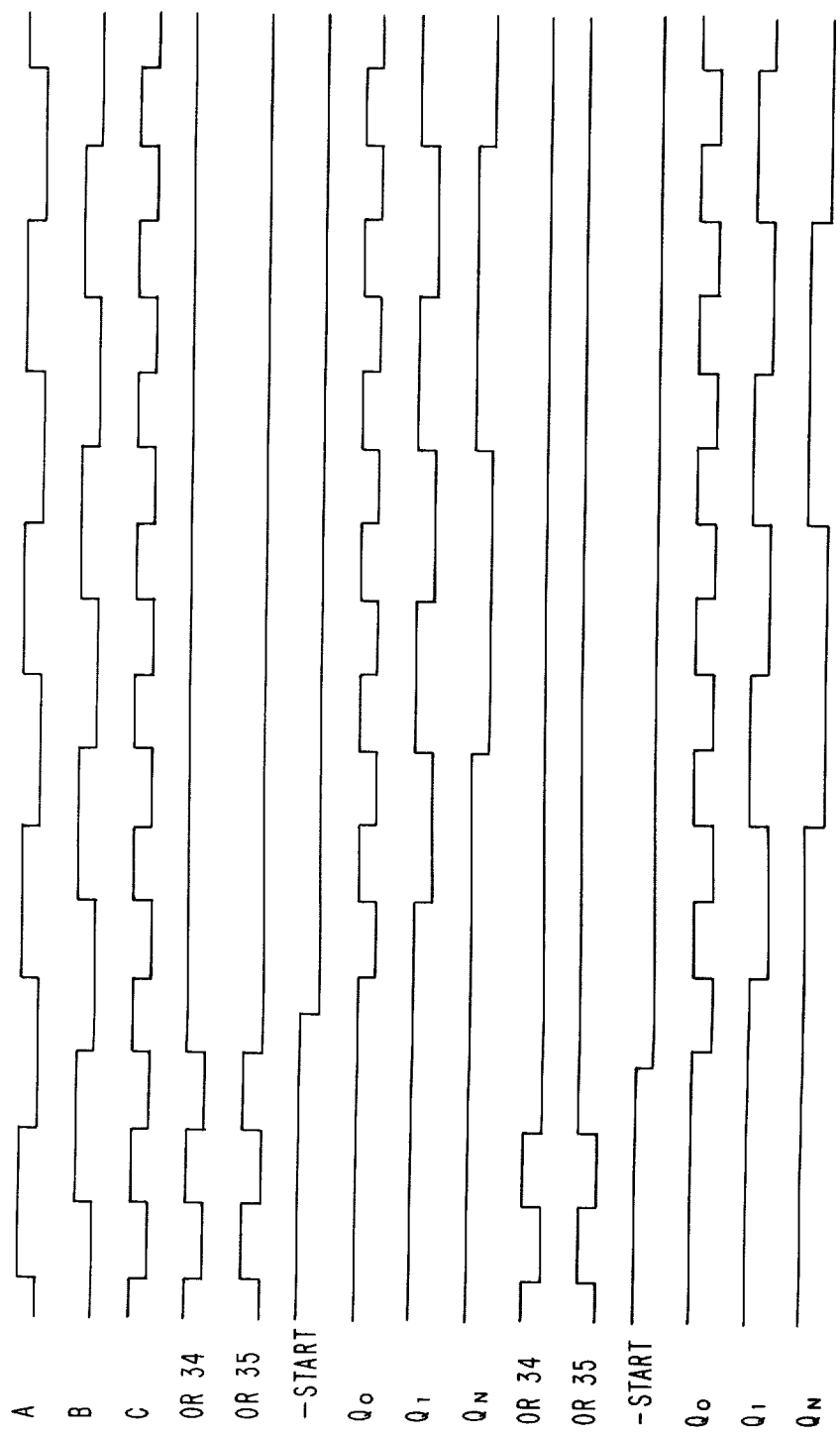
FIG. 3 is a timing diagram illustrating the relationship of the input signals, the single signal, the asynchronously occurring start signal, the stored level of the single signal and the counter outputs for the circuit of FIG. 2.

With reference to the drawings and particularly FIGS. 1 and 3, the invention is illustrated by way of example as having signals A and B, FIG. 3, applied to terminals 10 and 11 of FIG. 1. Terminals 10 and 11 are connected to inputs of exclusive OR circuit 15. The output of exclusive OR circuit 15 is a signal C as shown in FIG. 3 which has all of the transitions occurring in signals A and B. The output of exclusive OR circuit 15 is applied to a polarity hold or bistable latch circuit 30 which also receives an asynchronous start signal applied to terminal 12.

The start signal is also applied to AND circuits 37 and 38 to condition the same. Out-of-phase outputs from polarity hold 30 are applied to AND circuits 37 and 38 respectively. Polarity hold circuit 30 also provides an inverted signal of the output from exclusive OR circuit 15 to AND circuit 37 whereas the output of exclusive OR circuit 15 is directly applied to AND circuit 38. The outputs of AND circuits 37 and 38 are logically combined by OR circuit 39 which provides an advance signal to counter 40 and an output Q0 representing the first stage of counter 40. It should be noted that counter 40 is maintained reset until the occurrence of the start signal.

Figure 2:
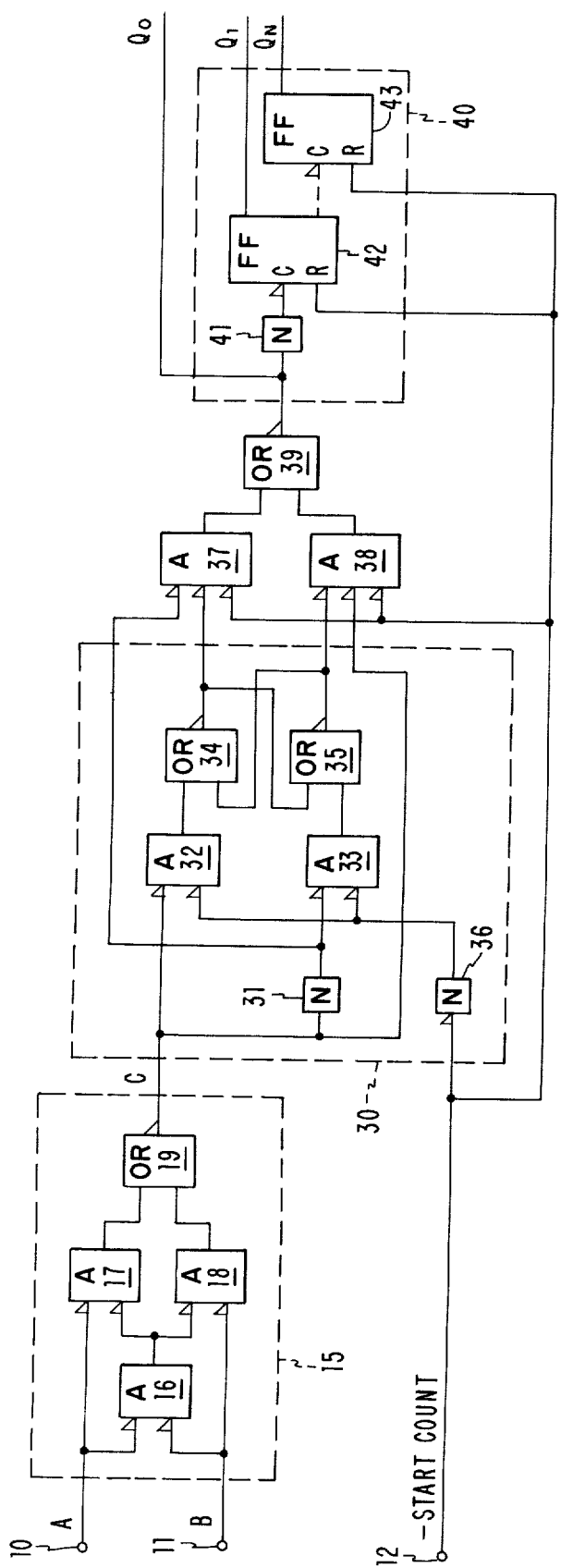
FIG. 2 is a schematic logic circuit diagram illustrating the embodiment of FIG. 1 in greater detail.

Exclusive OR circuit 15 consists of AND circuits 16, 17 and 18 and OR circuit 19 connected as shown in FIG. 2. The wedge-shape at the input or output of a logic element represents a down level condition for satisfying the requirements of the logic element. The output of exclusive OR circuit 15 is taken from OR circuit 19 and it is applied to inverter 31, AND circuit 32 and AND circuit 38. The output of inverter 31 is applied to AND circuits 33 and 37. AND circuits 32 and 33 are conditioned by the output of inverter 36 which is connected to start terminal 12. The outputs of AND circuits 32 and 33 feed OR circuits 34 and 35 respectively, which are interconnected to form the latch portion of polarity hold circuit 30. The output of OR circuit 34 is fed to AND circuit 37 while the output of OR circuit 35 is applied to AND circuit 38. It is seen that inverter 31 is used to provide the inverted output of exclusive OR circuit 15. The inverted signal from inverter 31 is applied to both polarity hold circuit 30 and AND circuit 37. The inverted signal insures that the proper state is stored in polarity hold circuit 30 and insures that the proper phase transitions are applied to counter 40.

As previously stated, AND circuits 37 and 38 feed OR circuit 39. The output of OR circuit 39 provides the Q0 output of counter 40 and also feeds inverter 41 which has its output connected to the clock input of trigger 42. The set output of trigger 42 provides the Q1 output of counter 40. The reset output of trigger 42 feeds the clock input of the next stage of the counter, which in this instance is shown as the n th stage represented by trigger 43.

The counting of the transitions in signals A and B is shown in FIG. 3. It is seen in FIG. 3 that all of the transitions occurring in signals A and B also occur in signal C. It is also seen that the outputs of OR circuits 34 and 35 follow the transitions of signal C until the occurrence of the start signal. The start signal is shown as occurring at two different times so as to illustrate the different signal levels held by polarity hold circuit 30. In one instance, the start signal is shown as occurring when the output of OR circuit 34 is at an UP level and the output of OR circuit 35 is at a DOWN level. The up and down levels of OR circuits 34 and 35 respectively, are then held by the polarity hold circuit as counter 40 counts the transitions occurring in signal C which of course is the output of exclusive OR circuit 15. This arrangement insures that the first transition occurring after the occurrence of the start signal will be counted and that both negative and positive transitions will be counted. The other start signal is shown to occur when the output of OR circuit 34 is at a down level and the output of OR circuit 35 is at an up level. These up and down levels are then held by polarity hold circuit 30 in a manner as previously indicated.

Figure 4:
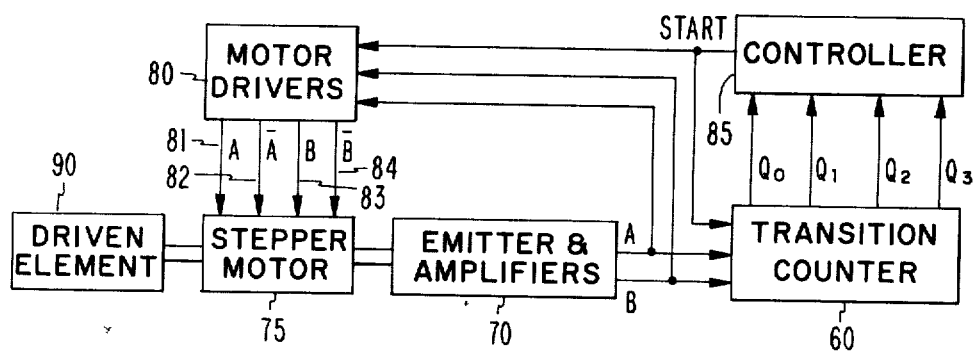
FIG. 4 is a schematic diagram illustrating the invention incorporated into a control system for controlling a stepping motor; and, FIG. 5 is a timing diagram illustrating a single signal containing all of the transitions of $n$ overlapped out of phase bi-level signals.

In FIG. 4 transition counter 60 counts the transitions occurring in signals A and B coming from emitter and amplifiers 70 where the emitter is driven by stepping motor 75. The signals A and B from amplifiers 70 are also fed to motor drivers 80 which are controlled by a start signal from controller 85. Motor drivers 80 provide signals on lines 81–84 inclusive for driving stepper motor 75. Signals for driving stepper motor 75 are provided by motor drivers 80 so long as there is a start signal from controller 85. Controller 85 receives transition counts from counter 60 and after a predetermined number of transitions have been counted, controller 85 drops the start signal. Stepper motor 75 is illustrated as operating driven element 90 which, as previously indicated, could be a carriage for advancing continuous forms in a printer. In this particular example, transition counter 60 provides outputs Q0–Q3 inclusive to controller 85. This provides controller 85 with the capability of dropping the start signal any time after the occurrence of a predetermined number of transitions, up to 16 transitions in this particular example.

Figure 5:
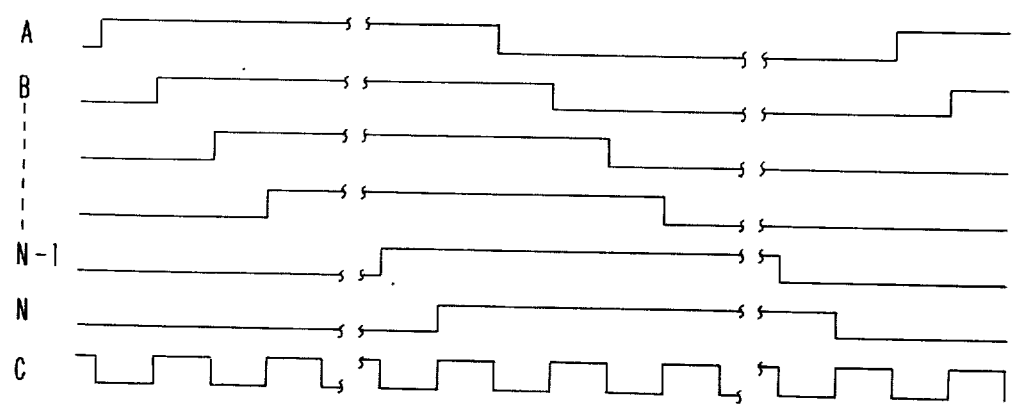

The invention, of course, is not limited to the particular embodiment or application illustrated. The number of overlapped out-of-phase bi-level signals can be increased to $n$ so long as there exists two $n$ combined logic level states and signal C contains the same number of transitions occurring in the $n$ input signals. This is illustrated in FIG. 5.

What is claimed is:

1. A counter circuit for counting signal transitions of overlapped out of phase bi-level signals in response to an asynchronously occurring start signal comprising means responsive to said overlapped out of phase bi-level signals for generating a single signal having signal transitions for every signal transition, positive and negative, occurring within said overlapped signals, means responsive to said start signal for storing the level of said single signal at the time said start signal occurs, binary counter means, and logic means responsive to said single signal and said stored level to provide counter advance signals to said binary counter means for each signal transition in said single signal.

2. The counter circuit of claim 1 wherein said means for generating a single signal having signal transitions for every signal transition occurring within said overlapped signals is logical exclusive OR circuitry.

3. The counter circuit of claim 2 wherein said logical exclusive OR circuitry comprises a first AND circuit connected to receive said overlapped out of phase bi-level signals, a second AND circuit connected to the output of said first AND circuit and connected to receive one of said out of phase bi-level signals, a third AND circuit connected to the output of said first AND circuit and connected to receive another of said out of phase bi-level signals, and an OR circuit connected to the outputs of said second and third AND circuits to provide an output at one level when the outputs of said second and third AND circuits are at levels different from each other and to provide an output at another level when the outputs of said second and third AND circuits are at the same level.

4. The counter circuit of claim 1 wherein said means for storing the level of said single signal at the time said start signal occurs is a polarity hold circuit.

5. The counter circuit of claim 4 wherein said polarity hold circuit comprises a first AND circuit connected to receive said single signal and said start signal, inverter means for inverting said single signal, a second AND circuit connected to receive said inverted single signal and said start signal, and a pair of OR circuits connected to each other to form a latch and connected to outputs of said first and second AND circuits whereby the level of said single signal is stored upon the occurrence of said start signal in the latch formed by said OR circuits.

6. The counter circuit of claim 1 wherein said logic means for providing said counter advance signals to said binary counter means forms the first stage of said binary counter means.

7. The counter circuit of claim 1 wherein said logic means for providing counter advance signals comprises a first AND circuit connected to receive said stored level, said single signal in inverted form and said start signal, a second AND circuit connected to receive said stored level, said single signal and said start signal, and an OR circuit connected to outputs of said first and second AND circuits to provide counter output signals for both negative and positive transitions occurring in said single signal.

* * * * *